United States Patent
Bar-Shalom

(10) Patent No.: US 9,118,347 B1
(45) Date of Patent: Aug. 25, 2015

(54) METHOD AND APPARATUS FOR OFDM ENCODING AND DECODING

(75) Inventor: Ofer Bar-Shalom, Kiryat Ono (IL)

(73) Assignee: MARVELL INTERNATIONAL LTD., Hamilton (BM)

( * ) Notice: Subject to any disclaimer, the term of this patent is extended or adjusted under 35 U.S.C. 154(b) by 373 days.

(21) Appl. No.: 13/596,136

(22) Filed: Aug. 28, 2012

Related U.S. Application Data

(60) Provisional application No. 61/529,060, filed on Aug. 30, 2011.

(51) Int. Cl.
| | | |
|---|---|---|
| *H04K 1/10* | (2006.01) | |
| *H04L 27/28* | (2006.01) | |
| *H03M 13/37* | (2006.01) | |
| *H03M 13/00* | (2006.01) | |
| *H04B 7/04* | (2006.01) | |
| *H03M 13/03* | (2006.01) | |

(52) U.S. Cl.
CPC .............. *H03M 13/03* (2013.01); *H03M 13/37* (2013.01); *H03M 13/6561* (2013.01); *H04B 7/0478* (2013.01)

(58) Field of Classification Search
CPC . H03M 13/03; H03M 13/37; H03M 13/6561; H04B 7/0478
USPC .......................... 375/260, 267, 295, 316, 324
See application file for complete search history.

(56) References Cited

U.S. PATENT DOCUMENTS

| | | | |
|---|---|---|---|
| 2006/0013181 A1* | 1/2006 | Stolpman et al. | 370/342 |
| 2007/0016837 A1* | 1/2007 | Candes et al. | 714/746 |
| 2011/0141122 A1* | 6/2011 | Hakura et al. | 345/505 |

* cited by examiner

*Primary Examiner* — Freshteh N Aghdam

(57) ABSTRACT

Systems and methods are provided for communicating on a cellular telecommunications network. A system includes a receiver interface configured to receive an orthogonal frequency division multiplexing (OFDM) signal that includes transmitted data encoded according to a particular coding matrix. A processing unit is configured to receive the OFDM signal, where the processing unit is configured to decode data from the OFDM signal by solving a matrix optimization. A computer-readable memory is configured to store the decoded data.

18 Claims, 10 Drawing Sheets

Fig. 7A

```
n = 128;        % Problem size
m = 3*n;
Nexp = 20;      % number of monte carlo runs
error_rate = linspace(0,0.5,20);
err = zeros(length(error_rate), 3, Nexp);
err_av = zeros(length(error_rate), 3);
x_hat = zeros(length(error_rate), 3, Nexp,n);

for kk = 1:length(error_rate)
    for jj = 1:3
        for nn = 1:Nexp
702 ┌─      A1   = randn(m,n);                    % Gaussian Coding matrix
    │       A2   = sign(A1);                      % Bernoulli Coding matrix
    └─      A3   = exp((1j.*pi.*A1));             % Fourier Coding Matrix
            A_mat = [A1; A2; A3];
            A    = A_mat(1+(jj-1)*m:jj*m,:);
            x0   = randi(64,n,1);                 n blocks of information
            support = randsample(m, round(error_rate(kk)*m)); % Choose error rate% of
704
            y    = A*x0;
706         y(support) = -100*y(support);% Corrupt error_rate% of the entries (flip the
the entries
sign and multiply by 100)
```

MATCH TO FIG. 7B

MATCH TO FIG.7A

```
            cvx_begin                                  % solve min||y-Ax||_1
                variable x(n)
                minimize (norm(y-A*x,1));
            cvx_end
708         x_hat(kk,nn,jj,:) = x;
            err_(kk,jj,nn) = norm((x-x0),2)/norm(x0,2);  % Check relative error
        end % nn
        err_av(kk,jj) = mean(err(kk,jj,:))
    end % jj
end % kk
figure
lg{1} = "b*-";
lg{2} = "pr-";
lg{3} = "^k-";

for jj = 1:3
    plot(error_rate, (1-err_av(:,jj)/n), lg{jj})
    hold on
end
legend( "Gaussian", "Bernoulli" , "Fourier", "Location" , "SouthWest" )
```

Fig. 7B

METHOD AND APPARATUS FOR OFDM
ENCODING AND DECODING

CROSS-REFERENCE TO RELATED APPLICATIONS

This application claims priority to U.S. Provisional Patent Application No. 61/529,060, filed Aug. 30, 2011, entitled "Method & Apparatus for OFDM Encoding/Decoding," which is herein incorporated in its entirety.

FIELD

The technology described herein relates generally to wireless communications and more particularly to encoding and decoding or wireless communications.

BACKGROUND

Error detection and correction techniques enable reliable delivery of digital data over unreliable communication channels. Many communication channels are subject to channel noise and other interference. Thus, errors may be introduced during transmission from a source to a receiver. Error detection techniques allow detecting such errors, while error correction enables reconstruction of the original data.

The description above is presented as a general overview of related art in this field and should not be construed as an admission that any of the information it contains constitutes prior art against the present patent application.

SUMMARY

Examples of systems and methods are provided for communicating on a cellular telecommunications network. In one embodiment of the disclosure, a system includes a receiver interface configured to receive an orthogonal frequency division multiplexing (OFDM) signal that includes transmitted data encoded according to a particular coding matrix. A processing unit is configured to receive the OFDM signal, where the processing unit is configured to decode data from the OFDM signal by solving a matrix optimization. A computer-readable memory is configured to store the decoded data.

In another embodiment of the disclosure, a method of communicating on a cellular telecommunications network includes receiving an orthogonal frequency division multiplexing (OFDM) signal that includes transmitted data encoded according to a particular coding matrix. The OFDM signal is provided to a processing unit. Data from the OFDM signal is decoded by solving a matrix optimization using the processing unit, and the decoded data is stored in a computer-readable memory.

BRIEF DESCRIPTION OF THE DRAWINGS

FIGS. 7A and 7B depict example Matlab code for simulating narrow band interference in a transmitted signal and for decoding data by solving a matrix optimization for each of a Gaussian, Bernoulli, and Fourier coding matrix.

DETAILED DESCRIPTION

Figure 1:
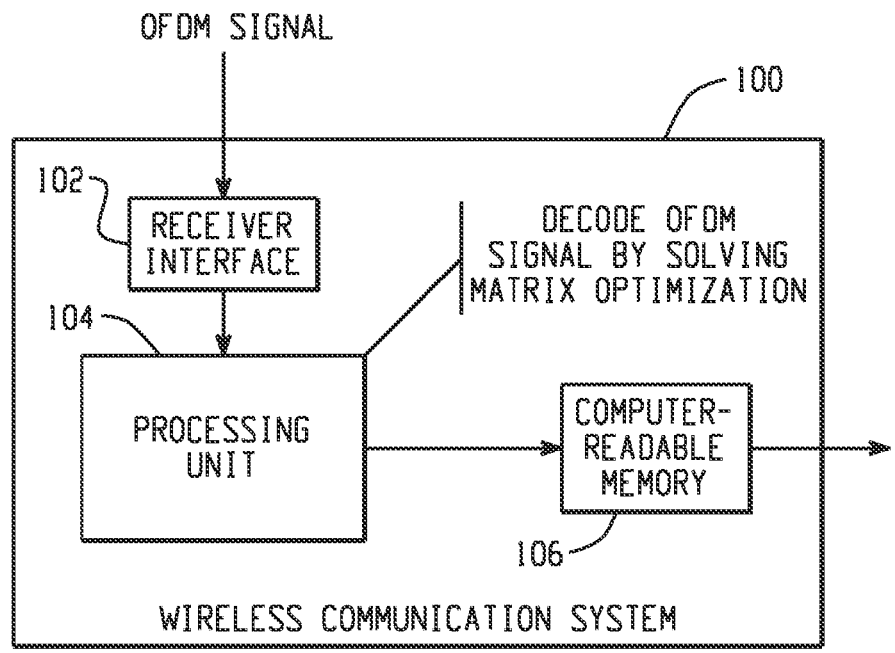
FIG. 1 is a simplified block diagram depicting a system for communicating on a cellular telecommunications network in accordance with an embodiment of the disclosure.

FIG. 1 is a simplified block diagram depicting a system 100 for participating in wireless communication in accordance with an embodiment of the disclosure. In the system 100, a receiver interface 102 is configured to receive an orthogonal frequency division multiplexing (OFDM) signal that includes transmitted data encoded according to a particular coding matrix. A processing unit 104 is configured to receive the OFDM signal. The processing unit 104 is configured to decode data from the OFDM signal by solving a matrix optimization, in an embodiment. A computer-readable memory 106 is configured to store the decoded data.

In one embodiment, OFDM or suitable multiple-input-multiple-output (MIMO) signals are decoded using a linear programming method. Such a method is capable of reconstructing an encoded vector of symbols with a very high rate of success, even when some of the symbols in the encoded vector are corrupted or missing, as long as the number of corrupted entries does not exceed a certain threshold. In one embodiment, such decoding is based on a mathematical optimization algorithm known as l1-norm minimization. Such decoding identifies the location and amplitudes of corrupted entries in an encoded vector and facilitates reconstruction of the encoded data despite the presence of errors.

Figure 2:
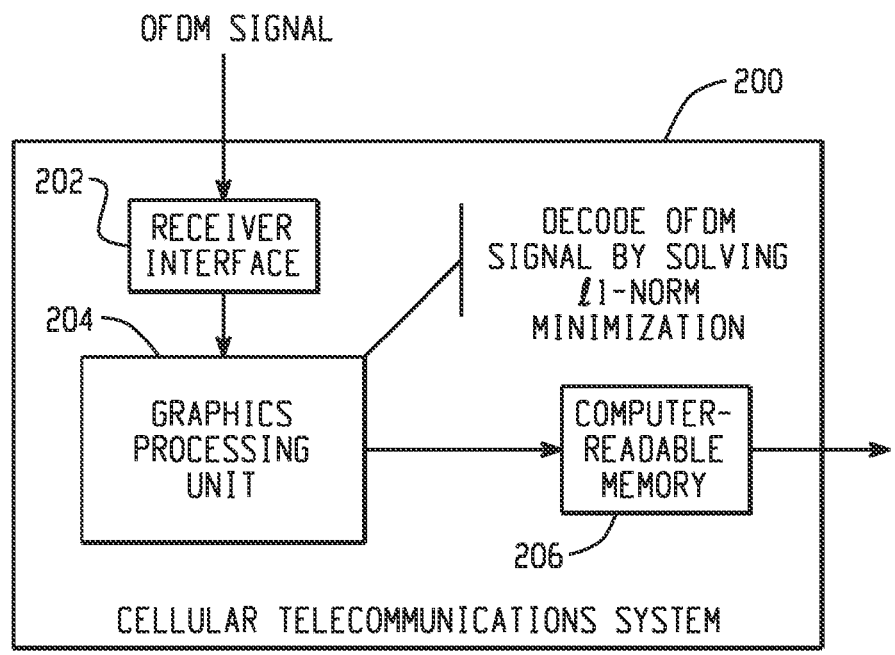
FIG. 2 is a block diagram depicting an example implementation of the system of FIG. 1 in a system for communicating on a cellular telecommunications network to provide forward error correction via an l1-norm minimization.

FIG. 2 is a block diagram depicting an example implementation of the system of FIG. 1 in a system 200 for communicating on a cellular telecommunications network to provide forward error correction via an l1-norm minimization. A receiver interface 202 is configured to receive an OFDM signal that includes transmitted data according to a particular coding matrix. A graphics processing unit 204 is configured to receive the OFDM signal and to decode data from the OFDM signal by solving a matrix optimization in the form of an l1-norm minimization.

In one embodiment, the graphics processing unit 204 is a multi-purpose component of a cellular telecommunications system 200, such as a cellular telephone, a smart phone, tablet or other computing device. In such an embodiment, the graphics processing unit 204 is configured to perform one or more graphics operations, such as processing data, images, and controls for display on a screen of the cellular telecommunications system 200, in addition to providing data decoding functionality.

In an embodiment, the graphics processing unit 204 is configured to solve the matrix optimization to decode the data by performing a plurality of vector processing operations, such as by using a linear programming decoding algorithm. The decoded data is provided to a computer-readable memory 206, such as a random access memory, a flash memory, a hard drive, or other volatile or non-volatile memory for storage.

Systems like those depicted in FIGS. 1 and 2 are useful in decoding and performing forward error correction on different types of received data signals, including OFDM signals. An OFDM symbol is constructed in the frequency domain using a number of closely-spaced, orthogonal sub-carrier frequencies (tones). Each sub-carrier is used for carrying data, either as a pilot sub-carrier or a data sub-carrier. Pilot tones are modulated with data that is known to a receiver, such as the wireless communication system of FIG. 1. The pilot data is processed by the receiver to estimate the complex channel attenuation along the OFDM symbol. The data tones are modulated with data according to a modulation scheme, such as quadrature phase shift keying (QPSK) or quadrature amplitude modulation (QAM) in an embodiment.

Figure 3:
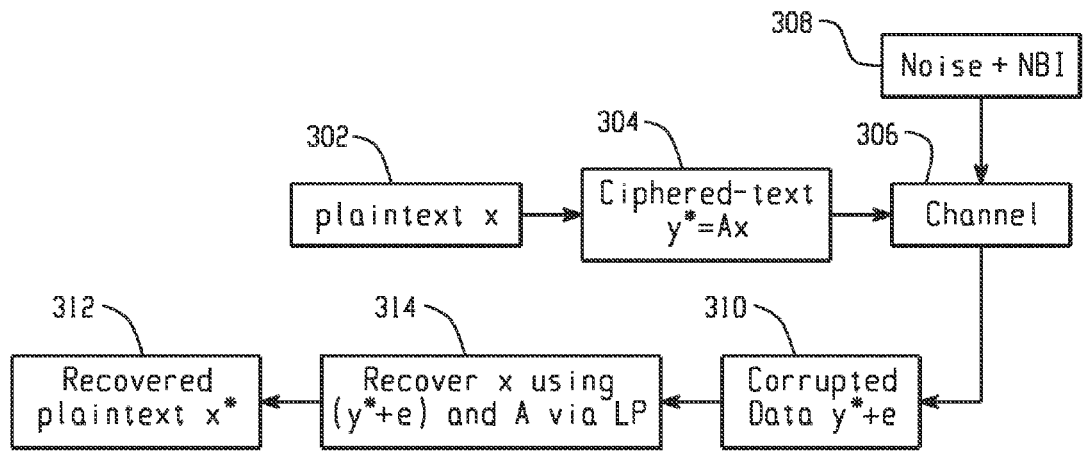
FIG. 3 is a flow diagram depicting an example process for communicating on a wireless communication network that provides forward error correction of transmitted data.

FIG. 3 is a flow diagram depicting an example process for communicating on a wireless communication network that provides forward error correction of transmitted data. The depicted error correction process seeks to recover an input vector x∈R" from a noise-corrupted received signal y=Ax+e, where y is a received vector of ciphered-text plus corruption, A is an m by n coding matrix, x is the plaintext input vector 302, and e is an arbitrary and unknown vector of errors, which is typically sparse such that most of its entries are zero, but some of the entries (for which their location is unknown) include an unknown corruption of the vector y*=Ax block 304.

In operation, the plaintext vector 302 is ciphered at 304 to generate y*=Ax by multiplying the plaintext vector 302 by the coding matrix, A. The ciphered text 304 is a vector of data signals that modulate the data sub-carriers of an OFDM symbol. The modulated data sub-carriers are transmitted across a channel 306, such as via a wired or wireless data transmission channel. During transmission, narrow band interference and other noise 308 is introduced to the data sub-carriers that are being transmitted, resulting in the receipt of corrupted data y*+e at the receiver at 310. The receiver recovers a plaintext vector x* 312, which is an approximation, and preferably exact match, of the transmitted plaintext vector x 302 at 314 using the received corrupted data y*+e 310, the known coding matrix A, and a linear programming matrix optimization.

In one embodiment, the linear programming matrix optimization 314 solves:

$$\|x\|_{l_1} = \sum_i |x_i| \quad \text{(Equation 1)}$$

$$\hat{x} = \underset{\tilde{x} \in R^n}{\operatorname{argmin}} \|y - A\tilde{x}\|_{l_1}.$$

This matrix optimization is solved, in an embodiment, as a linear program, namely as an optimization problem in which the objective and constraint functions are linear. The optimization problem can be recast as:

$$\min 1^T t$$

$$\text{s.t.} -t \le y - Ax \le t \quad \text{(Equation 2)}$$

which is equivalent to:

$$\min \sum_{i=1}^m t_i \quad \text{(Equation 3)}$$

$$\text{s.t.} \quad -t_i \le a_i^T x - y_i \le t_i \quad i = 1, \ldots, m,$$

$$x \in R^n, t \in R^m$$

where $a_i$ is the ith row of the coding matrix A.

The above described optimization successfully corrects errors and recovers the original plaintext vector, x, when the error rate, ρ, obeys:

$$\rho \le \rho^* = \frac{1 - n/m}{2}, \quad \text{(Equation 4)}$$

where n/m is the coding rate of the OFDM signal. For example, for a code-rate of 1/2, the error rate should be less than 25% for recovery. For example, less than 25% of the OFDM symbol tones should be corrupted by narrow band interference to ensure near perfect error correction.

Figure 4:
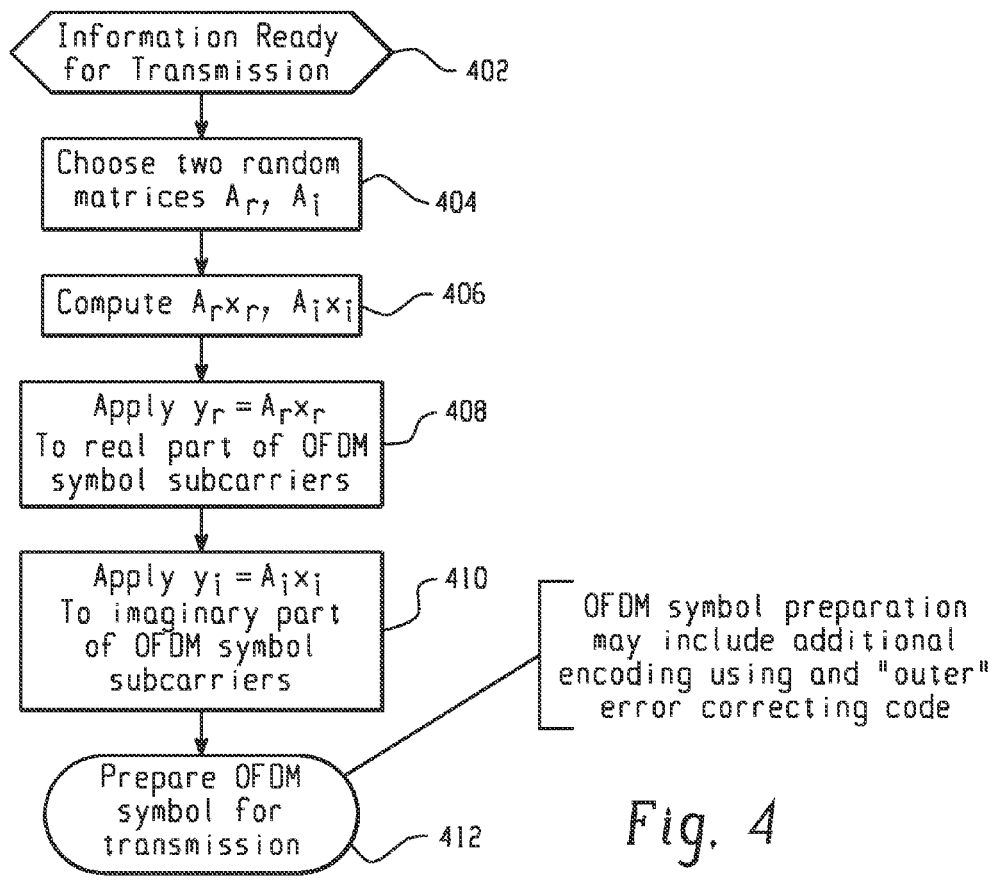
FIGS. 4 and 5 depict processes for encoding and decoding data, respectively, to implement the matrix optimization.
Figure 5:
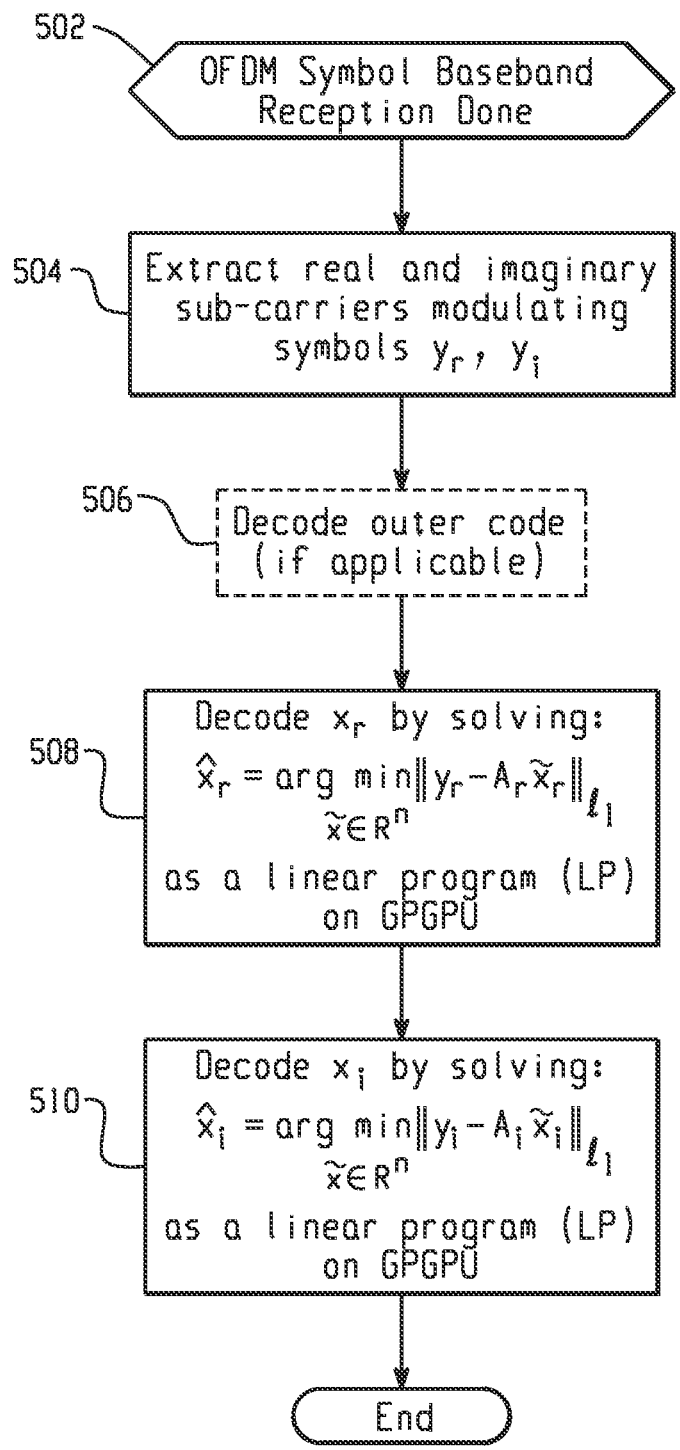

FIGS. 4 and 5 depict processes for encoding and decoding data, respectively, to implement the matrix optimization described above. FIG. 4 is a flow diagram depicting steps for encoding an OFDM signal for transmission in an embodiment. Having data that is ready for transmission at 402, two coding matrices are identified at 404. One coding matrix, $A_r$, will be used for encoding the real part of the data signal, while the second coding matrix, $A_i$, will be used to encode the imaginary part of the data signal. These matrices should be known to both the transmitter and receiver to enable successful encoding and decoding. The coding matrices may be static matrices or may be matrices that change, such as in a predictable way or in a way that is communicated between the transmitter and receiver, such as at a known time period using identical random number generators and a shared seed value. The data that is to be transmitted is segmented into its real and imaginary parts, $x_r$ and $x_i$ respectively, according to a modulation scheme, such as QPSK or QAM, and the respective coding matrices, $A_r$ and $A_i$, are used to compute the real and imaginary parts of the data signal, $A_r x_r$ and $A_i x_i$, respectively, at 406. After computing the encoded real and imaginary subparts at 406, the real subpart, $A_r x_r$, is applied to the real part of the OFDM symbol subcarriers at 408, and the imaginary subpart, $A_i x_i$, is applied to the imaginary part of the OFDM symbol subcarriers at 410. In one embodiment, additional preparation of the data signal is performed at 412, such as applying additional encoding via an outer error correcting code.

Certain decoding efficiencies can be obtained based on the type of coding matrix that is selected for encoding and decoding. A random Fourier ensemble matrix uses a signal that is a discrete function $f$ on Z/NZ, and the measurements are the Fourier coefficients at a randomly selected set, Ω, of frequencies of size M. As another example, a Gaussian ensemble is an m by n matrix having coefficients that are independent and identically distributed Gaussian variables. A Bernoulli ensemble is an m by n matrix having coefficients that are independent and identically distributed Bernoulli variables. A Gaussian ensemble can be generated in Matlab using the command: A1=randn(m,n); a Bernoulli ensemble can be generated in Matlab using the command: A2=sign(A1); and a random Fourier ensemble can be generated in Matlab using the command: A3=exp(1j.*pi.*A1).

FIG. 5 is a flow diagram depicting steps for decoding an OFDM signal at a receiver. OFDM symbol baseband reception is performed at 502, and the real and imaginary subcarriers modulating symbol vectors $y_r$, $y_i$, respectively are extracted at 504. Any outer code, such as an outer error correcting code applied at 412 in FIG. 4, is decoded at 506. The real portion of the data, $x_r$, is decoded at 508 by performing $$\hat{x}_r = \underset{\tilde{x}_r \in R^n}{\operatorname{argmin}} \|y_r - A_r \tilde{x}_r\|_{l_1} \quad \text{(Equation 5)}$$

as a linear program on a general purpose graphics processing unit. The imaginary portion of the data, $x_i$, is decoded at 510 by performing $$\hat{x}_i = \underset{\tilde{x}_i \in R^n}{\operatorname{argmin}} \|y_i - A_i \tilde{x}_i\|_{l_1} \quad \text{(Equation 6)}$$

as a linear program on a general purpose graphics processing unit.

Figure 6:
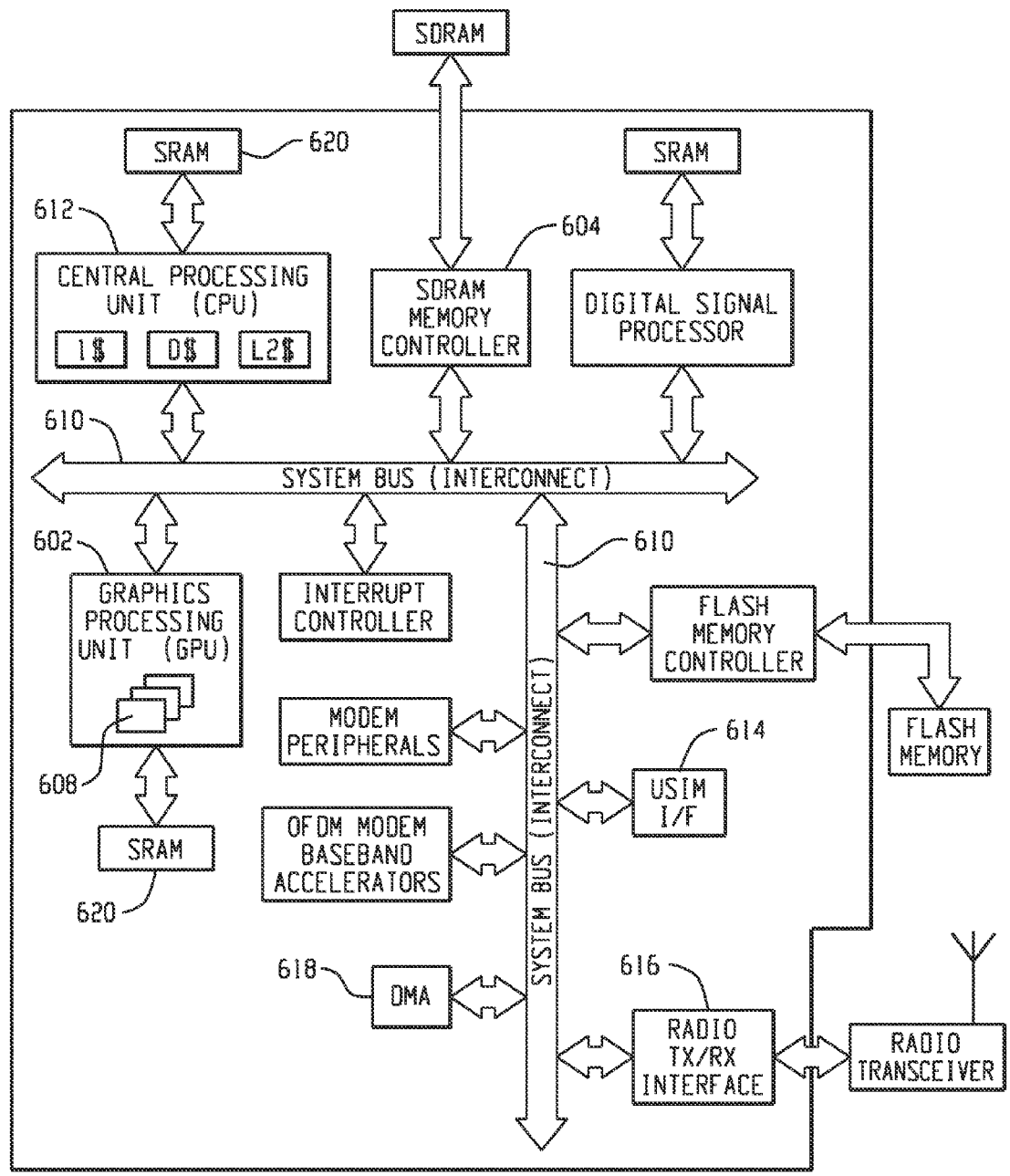
FIG. 6 is a block diagram depicting a graphics processing unit implemented as a modem peripheral for solving a matrix optimization.

A variety of system architectures are suitable for decoding data by performing a matrix optimization. In one embodiment, a matrix optimization in the form of an l1-norm minimization is solved by a system that includes a graphics processing unit (GPU) as a modem peripheral. FIG. 6 is a block diagram depicting a graphics processing unit implemented as a modem peripheral for solving a matrix optimization. A graphics processing unit 602 is used as a general purpose graphics processing unit (GPGPU) and is connected to a memory controller 604 (for example, by system bus 610) to achieve low memory access latency and high computational performance. The graphics processing unit 602 includes a plurality of shader core modules 608, such as four or more shader core modules 608, in an embodiment. Each shader core module 608 is configured to perform a graphical shading operation, and each shader core module 608 is further configured to perform other processing to solve a portion of the matrix optimization in parallel with other shader core modules 608. Such parallelization reduces decoding time, enabling higher data rates and/or power consumption reductions.

The modem depicted in FIG. 6 is designated for integration into a system on chip (SOC) architecture. The system includes a central bus 610 that interconnects components to a memory controller 604 that manages memory accesses to the internal or external memory devices. The system includes a central processing unit 612, a universal subscriber identity module (USIM) interface 614, a radio transmit/receive interface 616, and a direct memory access (DMA) engine 618.

The graphics processing unit 602 is integrated into the system in a similar fashion as other peripherals via the system bus 610. In an embodiment, the graphics processing unit 602 includes software-configurable registers that are configured by software executed on the CPU to configure functionality of the graphics processing unit 602. In one embodiment, the graphics processing unit 602 integrates multiple shader core modules 608 that operate as single-instruction-multiple data (SIMD) processors for accelerating vector and matrix operations. In one embodiment, both the central processing unit 612 and the graphics processing unit 602 have respective static random access memory storage (SRAM) 620, where the graphics processing unit 602 utilizes its respective SRAM for storing coding matrices and other values.

FIGS. 7A and 7B depict example Matlab code for simulating narrow band interference in a transmitted signal and for decoding data by solving a matrix operation for each of a Gaussian, Bernoulli, and Fourier coding matrices, in an embodiment. A first portion of the code 702 generates the Gaussian, Bernoulli, and Fourier coding matrix to be used during a particular run of the simulation. At 704, the data, xo, is encoded according to the coding matrices, and at 706, the encoded data is corrupted according to a specified error rate to simulate narrow band interference during transmission. At 708, the matrix optimization is performed via an t l1-norm minimization to decode the data. The remaining code determines an accuracy of the decoding for each of the three types of coding matrices and plots the results. Note the example of FIGS. 7A and 7B is demonstrated for a vector of real-valued integers. In one embodiment, a similar encoding/decoding process is applied separately to the real and imaginary parts of the symbols.

Figure 8:
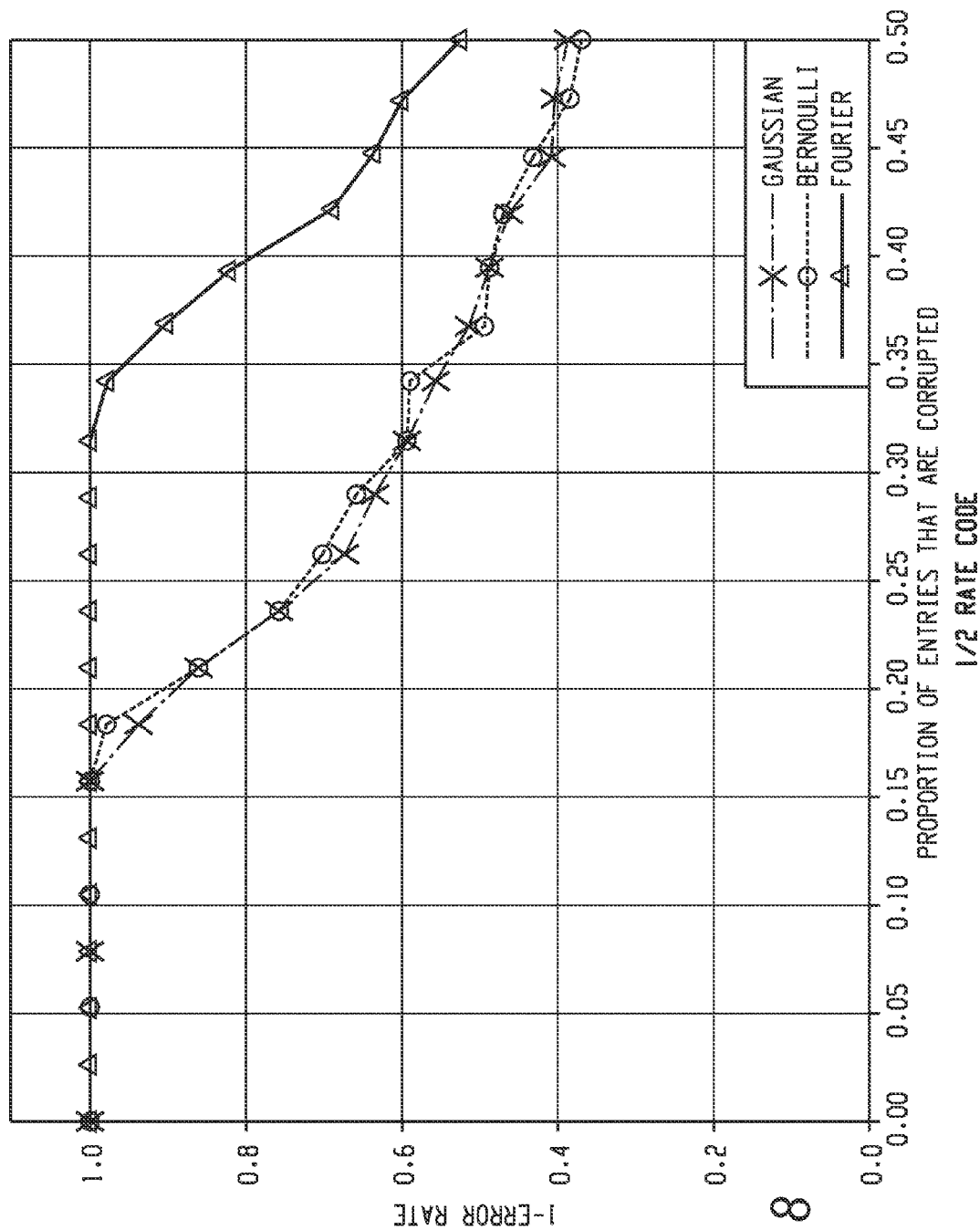
FIGS. 8-10 depict simulated plaintext recovery abilities for different code rates and three different types of coding matrices.
Figure 9:
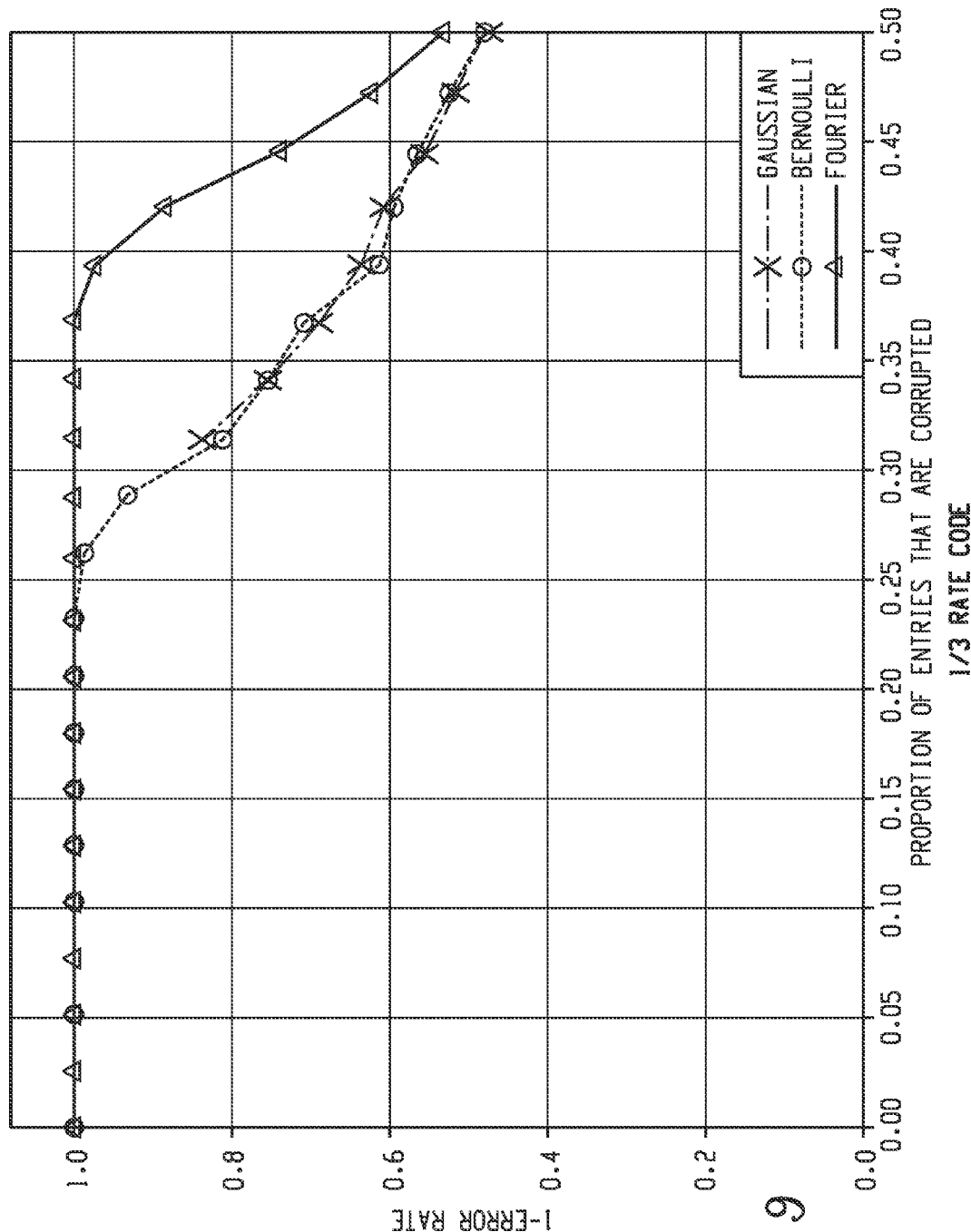
Figure 10:
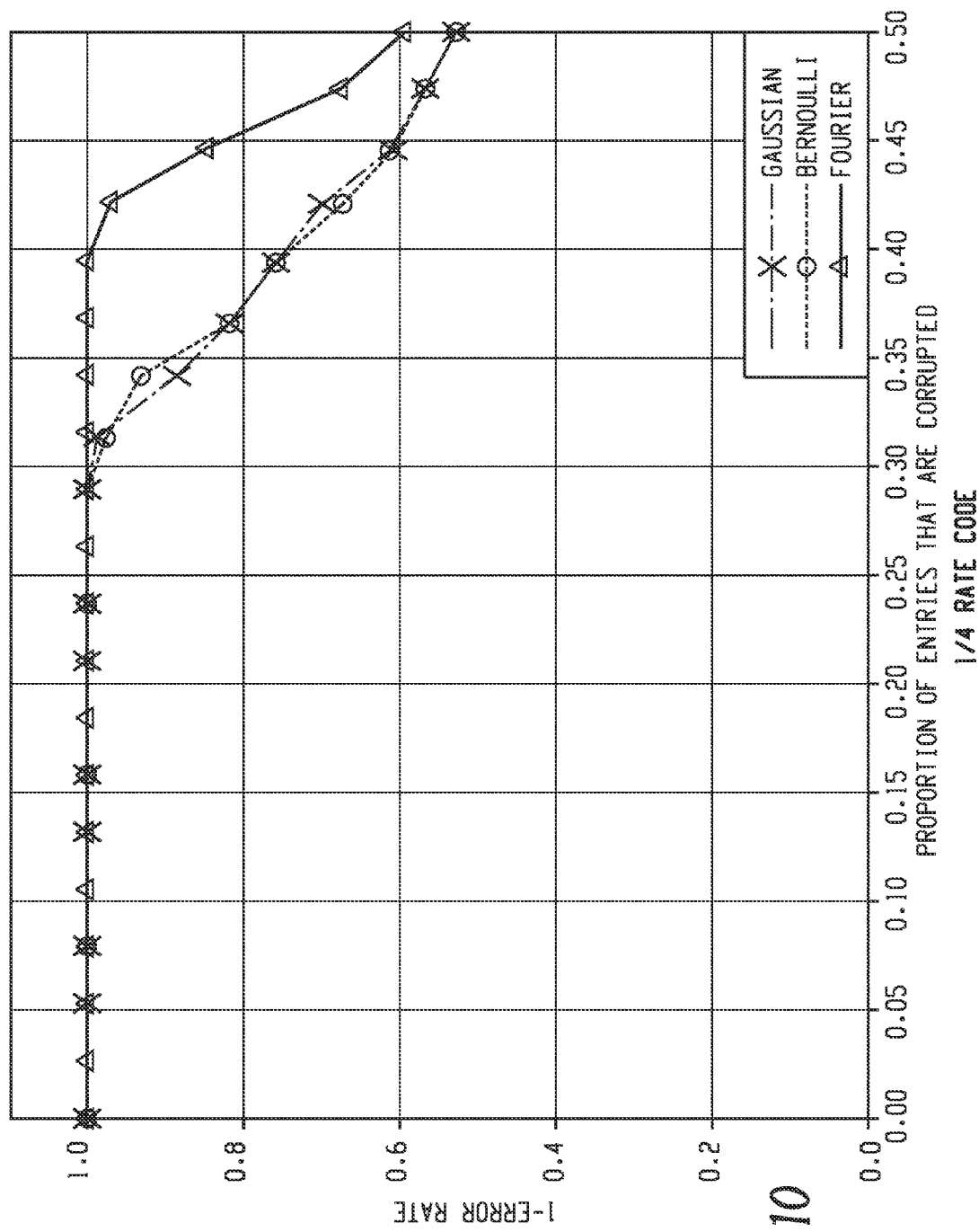

FIGS. 8-10 depict simulated plaintext recovery abilities for different code rates and three different types of coding matrices. FIG. 8 depicts example recovery rates for Gaussian, Bernoulli, and Fourier coding matrices using a matrix optimization to decode data from a signal transmitted at a 1/2 code rate. When using the Fourier coding matrix, the matrix optimization is able to provide forward error correction at 100% accuracy when over 30% of the data values are corrupted. FIG. 9 depicts example recovery rates for Gaussian, Bernoulli, and Fourier coding matrices using a matrix optimization to decode data from a signal transmitted at a 1/3 code rate. When using the Fourier coding matrix, the matrix optimization is able to provide forward error correction at 100% accuracy when over 35% of the data values are corrupted. FIG. 10 depicts example recovery rates for Gaussian, Bernoulli, and Fourier coding matrices using a matrix optimization to decode data from a signal transmitted at a 1/4 code rate. When using the Fourier coding matrix, the matrix optimization is able to provide forward error correction at 100% accuracy when over 38% of the data values are corrupted.

Figure 11:
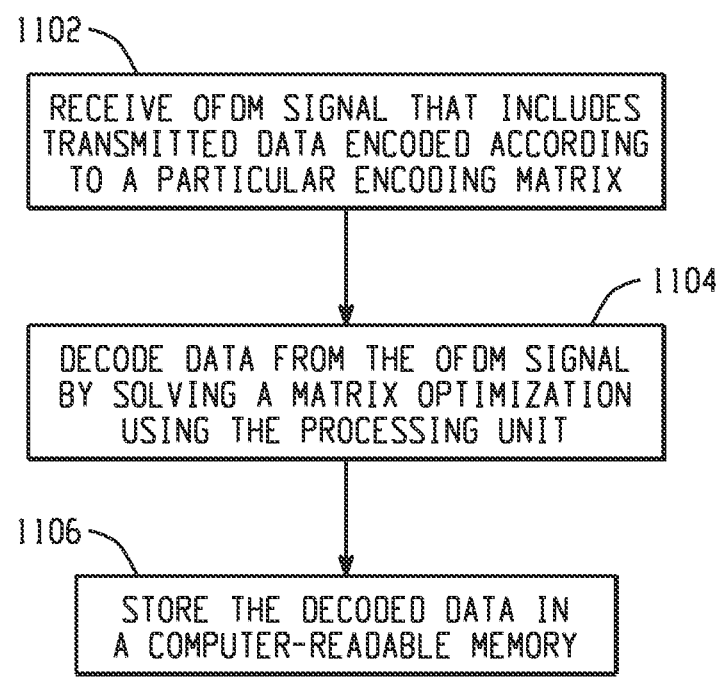
FIG. 11 is a flow diagram depicting a processor-implemented method of communicating on a cellular telecommunications network.

FIG. 11 is a flow diagram depicting a processor-implemented method of communicating on a cellular telecommunications network. At 1102, an orthogonal frequency division multiplexing (OFDM) signal is received that includes transmitted data that is encoded according to a particular encoding matrix. At 1104, the data is decoded from the OFDM signal by solving a matrix optimization using a processing unit. At 1106, the decoded data is stored in a computer-readable memory. For example, in an embodiment, the processing unit is a graphics processing unit, where the OFDM signal is provided to a plurality of shader core modules of the graphics processing unit for performing the matrix optimization in parallel. In an embodiment, the plurality of shader core modules perform the matrix optimization as an l1-norm minimization.

This application uses examples to illustrate the invention. The patentable scope of the invention may include other examples.

What is claimed is:

1. A system for communicating on a cellular telecommunications network, comprising:
   a receiver interface configured to receive an orthogonal frequency division multiplexing (OFDM) signal that includes transmitted data encoded according to a particular coding matrix;
   a processor configured to receive the OFDM signal, the processor being configured to decode data from the OFDM signal by solving a matrix optimization, wherein the processor is configured to decode the data from the OFDM signal without error when an error rate, $\rho$, of the OFDM signal is less than $$\frac{1-n/m}{2},$$

where n/m is a code-rate of the OFDM signal; and
a computer-readable memory configured to store the decoded data.

2. The system of claim 1, wherein the processor is a graphics processing unit, and wherein the graphics processing unit is configured to perform one or more graphics operations in addition to decoding the data from the OFDM signal.

3. The system of claim 2, wherein the graphics processing unit is configured to solve the matrix optimization by performing a plurality of vector processing operations.

4. The system of claim 1, wherein the processor further comprises:
a plurality of shader core modules, wherein each shader core module is configured to perform a graphical shading operation, and wherein each of the shader core modules is further configured to solve a portion of the matrix optimization in parallel.

5. The system of claim 4, wherein the processor is configured to divide the OFDM signal into real and imaginary subcarriers, and wherein the processor is configured to provide portions of the matrix optimization to the shader core modules based on the division of the OFDM signal.

6. The system of claim 1, wherein the processor is configured to solve the matrix optimization using the particular coding matrix.

7. The system of claim 1, wherein the processor is configured to provide forward error correction of the OFDM signal by solving the matrix optimization.

8. The system of claim 1, wherein the matrix optimization is an l1-norm minimization.

9. The system of claim 8, wherein the processor is configured to solve the l1-norm minimization as a linear program comprising a plurality of matrix operations.

10. The system of claim 1, wherein the processor is configured to optimize:

$$\|x\|_{l_1} = \sum_i |x_i|$$

$$\hat{x} = \underset{\tilde{x} \in R^n}{\mathrm{argmin}} \|y - A\tilde{x}\|_{l_1},$$

where A is the particular coding matrix, x is the transmitted data, y is the OFDM signal, $\hat{x}$ is the decoded data, i is a variable used in a summation operation, arg min is a minimization, and $R^n$ is a real coordinate space of n dimensions.

11. The system of claim 1, wherein the particular coding matrix is known to the system and to an encoder, and wherein the particular coding matrix periodically changes.

12. The system of claim 1, wherein the particular coding matrix is a random Fourier ensemble, a Gaussian ensemble, or a Bernoulli ensemble.

13. A method of communicating on a cellular telecommunications network, comprising:
receiving an orthogonal frequency division multiplexing (OFDM) signal that includes transmitted data encoded according to a particular coding matrix;
decoding data from the OFDM signal by solving a matrix optimization using a processor, wherein the data from the OFDM signal is decoded without error when an error rate, ρ, of the received OFDM signal is less than $$\frac{1-n/m}{2},$$

where n/m is a code-rate of the OFDM signal; and
storing the decoded data in a computer-readable memory.

14. The method of claim 13, wherein the processor is a graphics processing unit, wherein the method further comprises:
performing one or more graphics operations using the graphics processing unit.

15. The method of claim 13, wherein the OFDM signal is provided to a plurality of shader core modules of the processor for performing the matrix optimization in parallel.

16. The method of claim 13, further comprising:
dividing the OFDM signal into real and imaginary subcarriers, wherein the data from the OFDM signal is decoded in parallel by the processor based on the dividing.

17. The method of claim 13, wherein the matrix optimization is an l1-norm minimization, wherein the data is decoded by solving the l1-norm minimization as a linear program comprising a plurality of matrix operations.

18. The method of claim 13, wherein the matrix optimization optimizes:

$$\|x\|_{l_1} = \sum_i |x_i|$$

$$\hat{x} = \underset{\tilde{x} \in R^n}{\mathrm{argmin}} \|y - A\tilde{x}\|_{l_1}.$$

where A is the particular coding matrix, x is the transmitted data, y is the received OFDM signal, $\hat{x}$ is the decoded data, i is a variable used in a summation operation, arg min is a minimization, and $R^n$ is a real coordinate space of n dimensions.

* * * * *